United States Patent [19]

Vallancourt et al.

[11] Patent Number: 5,675,341
[45] Date of Patent: Oct. 7, 1997

[54] CURRENT-MODE PARALLEL ANALOG-TO-DIGITAL CONVERTER

[75] Inventors: David Gerard Vallancourt, Macungie, Pa.; Thayamkulangara Ramaswamy Viswanathan, Addison, Tex.

[73] Assignee: Lucent Technologies Inc., Murray Hill, N.J.

[21] Appl. No.: 459,920

[22] Filed: Jun. 2, 1995

[51] Int. Cl.[6] .................... H03M 1/34; H03M 1/36
[52] U.S. Cl. ............................ 341/158; 341/159
[58] Field of Search ........................ 341/155, 158, 341/159

[56] References Cited

U.S. PATENT DOCUMENTS

| | | | |
|---|---|---|---|
| 4,926,176 | 5/1990 | Lewyn et al. | 341/135 |
| 4,942,399 | 7/1990 | Buchholtz et al. | 341/143 |
| 4,951,053 | 8/1990 | DesJardin et al. | 341/136 |
| 4,978,959 | 12/1990 | Chong et al. | 341/161 |
| 5,283,582 | 2/1994 | Krenik | 341/158 |
| 5,369,406 | 11/1994 | Hughes et al. | 341/135 |

*Primary Examiner*—Jeffrey A. Gaffin
*Assistant Examiner*—Thuy-Trang N. Huynh
*Attorney, Agent, or Firm*—David M. Sigmond; John P. Veschi

[57] ABSTRACT

An analog-to-digital converter includes first current sources, second current sources, current regulators, and conductive channels, with each conductive channel coupled to a respective first current source, second current source, and current regulator. An analog input is split into the first current sources. Each second current source is associated with a unique reference current. At each channel where the first current source couples a larger current than the reference current, the current regulator couples a difference current to allow the second current source to couple the reference current. Alternatively, at each channel where the first current source couples a smaller current than the reference current, the current regulator does not couple a difference current, and the second current source couples the same current as the first current source.

28 Claims, 2 Drawing Sheets

CURRENT-MODE PARALLEL ANALOG-TO-DIGITAL CONVERTER

TECHNICAL FIELD

The invention relates generally to analog-to-digital converters, and more particularly to parallel analog-to-digital converters that convert current-mode analog inputs into digital outputs.

BACKGROUND OF THE INVENTION

Analog-to-digital (A/D) converters are well known in the art and used in a variety of applications that require converting an analog input into a digital output. Such conversion is necessary to interface real-world systems, which typically include continuously varying analog signals, with digital systems.

A very large number of A/D converters are available from manufacturers and described in the literature. General categories of A/D converters include parallel (also called comparator or flash) converters, successive approximation converters, and counting converters. The analog input may be specified in terms of voltage or current. Major performance factors include analog input range, input impedance, sampling rate, accuracy, stability, conversion time, power consumption, and space requirements.

Parallel A/D converters are known which simultaneously compare an analog input voltage with $2^N-1$ reference voltages to produce an N-bit digital code. Typical circuitry includes a precision resistor ladder network, $2^N-1$ comparators, and a digital priority encoder. The resistor network establishes reference voltages for each allowed quantization level. The comparators indicate whether or not the analog input voltage is above or below the reference voltage at each level. The comparators send a $2^N-1$ element digital code to a priority encoder. The priority encoder produces the final N-bit binary digital code compatible with standard logic families. See generally *Digital Logic: Analysis, Application and Design* by S. Carrod and R. Bores, 1991, by Saunders College Publishing, p. 928.

Parallel A/D converters are capable of great speed since the entire conversion process occurs simultaneously rather than sequentially. Upon presentation of the analog input voltage, and after a short delay in the comparators, a digital representation of the analog input voltage is available. Typical conversion times range from 10 to 50 ns. Such high speed conversion is suitable for high-speed data acquisition applications such as TV video digitizing, radar analysis, transient analysis, medical ultrasound imaging, and high-energy physics.

A primary shortcoming and deficiency with conventional parallel A/D converters is the use of a resistor ladder network. The resister ladder network occupies a relatively large space on an integrated circuit chip. In addition, the resistor ladder network may be difficult or expensive to precisely fabricate on an integrated circuit chip. Another common deficiency with conventional parallel A/D converters is that analog inputs are often specified as voltages although certain components of the converters operate on currents. This may require an A/D converter to convert voltage signals into current signals. Converting voltage signals into current signals may require additional components (such as resistors) and introduce noise. Accordingly, there is a need for a current-mode parallel A/D converter without a resistor ladder network.

SUMMARY OF THE INVENTION

These and other needs may be realized by the present invention. A primary aspect is an integrated circuit chip which performs parallel A/D conversion without a resistor ladder network. Another aspect is performing A/D conversion on analog input currents rather than analog input voltages (i.e., current-mode). The inventive technique provides a relatively simple, inexpensive A/D converter that is well-suited for fabrication on an integrated circuit chip.

In accordance with an embodiment of the invention, an analog-to-digital converter includes first current sources, second current sources, current regulators, and conductive channels, with each conductive channel coupled to a respective first current source, second current source, and current regulator. An analog input current is split into the first current sources. Each second current source is associated with a unique reference current. The channels support unidirectional current flow between first and second current sources. At each channel where the first current source couples a larger current than the reference current, the current regulator couples a difference current to allow the second current source to couple the reference current. This produces a first logic state associated with that channel. Alternatively, at each channel where the first current source couples a smaller current than the reference current, the current regulator does not couple a difference current. This forces the second current source to couple the same current as the first current source, and produces a second logic state. In this manner, the channels operate in parallel to provide a digital code with one-to-one correspondence between channels and logic states.

In certain embodiments of the invention, the converter may comprise $2^N$ first current sources, each coupling to a respective channel a substantially constant current of approximately $I_{in}/2^N$. The converter may also comprise $2^N$ second current sources, each coupling to a respective channel either the associated reference current or $I_{in}/2^N$. Preferably, the reference currents are monotonically increasing. For instance, the reference currents may be distributed as $(J/2^N)(I_{max}/2^N)$, with J being an integer in the range of 1 to $2^N$, and $I_{max}$ being the upper limit of $I_{in}$. This provides reference currents with a constant quantization level of $I_{max}/2^{2N}$.

In various embodiments of the invention, the first current source includes a first metal-oxide-semiconductor (MOS) transistor, the second current source includes a second MOS transistor, and the current regulator includes a diode. When current from the first transistor exceeds the reference current, the diode couples the difference current to the channel and the second transistor couples the reference current to the channel. Alternatively, when current from the first transistor is smaller than the reference current, the diode couples essentially zero current to the channel and the second transistor couples the same current to the channel as the first transistor. Thus, when a current mismatch occurs between the first and second transistors, and the current regulator does not couple a difference current, then the second transistor adjusts to the current of the first transistor. This is accomplished by providing the first transistor with a substantially higher output impedance than the second transistor. The drain-to-source voltage of the first transistor increases without substantially affecting the first transistor's drain current, whereas the drain-to-source voltage of the second transistor decreases by a similar amount so that the second transistor's drain current matches that of the first transistor.

BRIEF DESCRIPTION OF THE DRAWING

The invention, together with its various features and advantages, can be readily understood from the following detailed description taken in conjunction with the accompanying drawings, in which.

DETAILED DESCRIPTION

Figure 1:
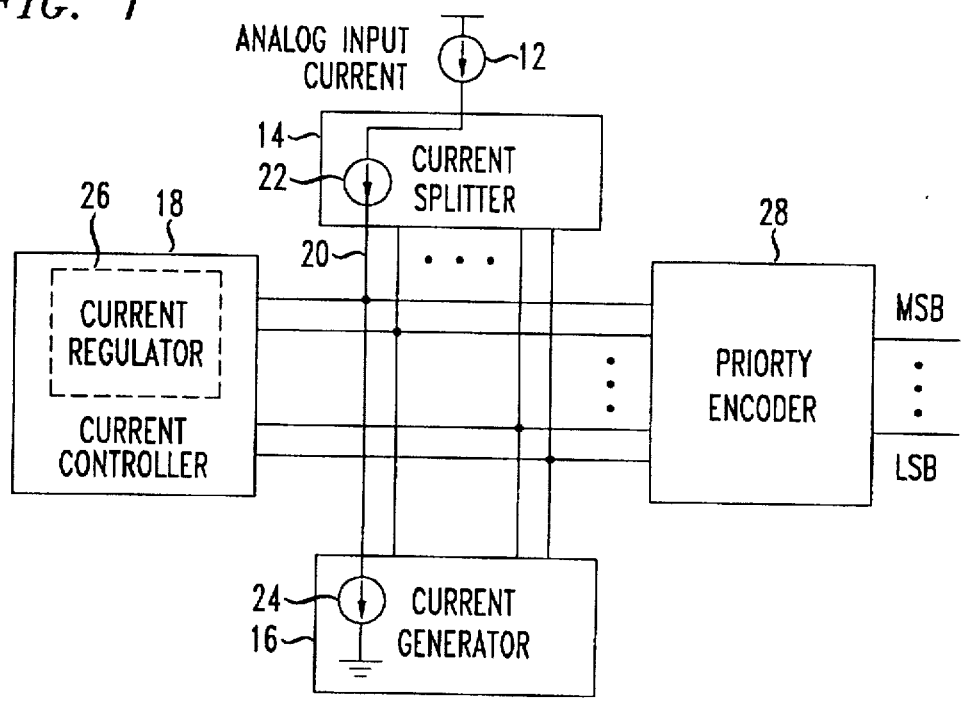
FIG. 1 is a simplified schematic block diagram illustrating an embodiment of the present invention in a typical operating environment.

Referring to FIG. 1, there is shown a simplified schematic block diagram illustrating an embodiment of the present invention in a typical operating environment. As illustrated, current source 12 injects the analog input current into the first current sources, the first current sources inject current into the channels, the second current sources draw current from the channels, and the difference currents, if any, are injected into the channels. It is understood that the direction of current flows could be reversed.

As is seen, current source 12 is coupled to current splitter 14. Current splitter 14 includes a plurality of first current sources coupled to current source 12. Preferably, each first current source generates a substantially constant current equivalent to the analog input current divided by the number of first current sources. Current generator 16 includes a plurality of second current sources. Each second current source is associated with a unique reference current. That is, the reference current is different for each second current source. Preferably, the reference currents are monotonically increasing and differ from one another by a constant quantization level. If desired, the reference currents may be exponentially increasing, or related in some other manner. Current controller 18 includes a plurality of current regulators. A plurality of conductive channels 20 are coupled between current splitter 14, current generator 16 and current controller 18. Each channel 20 is coupled in one-to-one relationship to a respective first current source, second current source, and current regulator. For brevity, a single first current source 22, a single second current source 24, and a single current regulator 26 are shown. Each channel 20 is also coupled to an optional priority encoder 28.

As illustrated, current source 12 injects the analog input current into the first current sources, the first current sources inject current into the channels, the second current sources draw current away from the channels, and the difference currents, if any, are drawn away from the channels. Thus, the channels support unidirectional current flow between the first and second current sources. It is understood that in other embodiments the direction of current flows can be reversed.

In operation, current source 12 couples the analog input current to current splitter 14, and each first current source couples a portion of the analog input current to a respective channel 20. In each channel, it is necessary to compare the current from the first current source with the reference current associated with the second current source. If the current from the first current source is larger than the reference current, then the difference current will be coupled by the current regulator and the channel assumes a first voltage. A first logic state is indicated, for instance, by the first voltage or by the difference current. Alternatively, if the current from the first current source is less than the reference current, then the second current source will adjust to couple the same current as the first current source since the current regulator does not couple a difference current. A second logic state is indicated, for instance, by the channel assuming a second voltage, or by the absence of a difference current. As a result, the channels provide a digital code associated with the analog input current, with each channel representing a logic state. Preferably, all channels indicating the first logic state are adjacent one another, and all channels indicating the second logic state are adjacent one another.

Priority encoder 28 converts the digital code provided by the channels into a binary digital code. The priority encoder may also convert the first and second voltages into standard digital voltage levels (such as 5 volts and ground, respectively). Or, separate circuitry may convert the first and second voltages into standard digital voltage levels which are coupled to the priority encoder. In any event, priority encoder 28 is not essential to the present invention.

The preferred mechanism for adjusting the second current source to the first current source is by designing a higher output impedance at the first current source than at the second current source. In this manner, a current mismatch between the first and second current sources is resolved by increasing the voltage drop across the first current source while decreasing the voltage drop across the second current source. Since the first current source has a relatively high output impedance, its current remains substantially constant, whereas since the second current source has a relatively low output impedance, its current adjusts to match that of the first current source.

Figure 2:
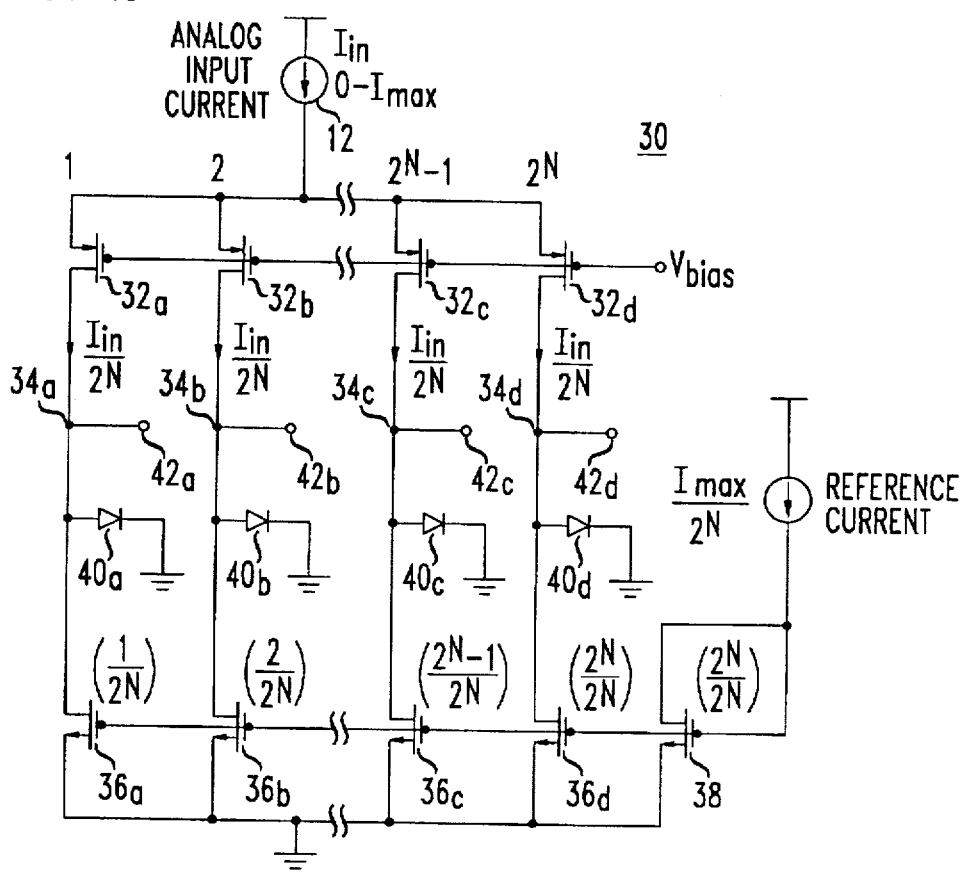
FIG. 2 is a simplified circuit diagram for implementing an embodiment of the present invention.

Referring to FIG. 2, there is shown a simplified circuit diagram 30 illustrating another embodiment of the present invention. As is seen, current source 12 generates an analog input signal $I_{in}$ in the range of approximately 0 to $I_{max}$. The first current sources are $2^N$ substantially matched p-channel MOS transistors 32, shown as transistors 32a–32d. Transistors 32 are matched, for instance, by having similar channel width-to-length ratios. Idealistically, the transistors 32 would have identical channel width-to-length ratios; however, due to practical limitations of the manufacturing process, there will be some minor variations among the ratios. Each transistor 32 has a source coupled to current source 12 to receive a portion of $I_{in}$. Each transistor 32 also has a gate coupled to a common bias voltage $V_{bias}$. Transistors 32 have low source impedance and high drain impedance. In effect, transistors 32 function as high impedance current splitters. As a result, each transistor 32 couples a substantially constant current of approximately $I_{in}/2^N$ to a respective conductive channel. The range of current for each transistor 32 is approximately 0 to $I_{max}/2^N$, depending on the magnitude of $I_{in}/2^N$. Thus, the currents for transistors 32 are controlled by and linearly correspond to $I_{in}$.

The conductive channels are $2^N$ common drain connections 34, shown as connections 34a–34d. Connections 34 may be any low resistance path such as copper or aluminum metallization.

The second current sources are $2^N$ n-channel MOS transistors 36, shown as transistors 36a–36d. The reference currents for transistors 36 evenly dispersed within the range of approximately $I_{max}/2^{2N}$ to $I_{max}/2^N$. Thus, the reference currents are monotonically increasing and differ from one another by a constant quantization level of $(I_{max}/2^{2N})(1/2^N)$ or $I_{max}/2^{2N}$. Accordingly, the reference currents are distributed as approximately $(J/2^N)(I_{max}/2^N)$, with J being an integer in the range of 1 to $2^N$. For example, the reference current for transistor 36a is ($\frac{1}{2}^N$) ($I_{max}/2^N$), the reference current for transistor 36b is ($2/2^N$) ($I_{max}/2^N$), the reference current for transistor 36c is (($2^N-1)/2^N$)($I_{max}/2^N$), and the reference current for transistor 36d is ($2^N/2^N$)($I_{max}/2^N$). This is accomplished using a current mirror arrangement. In particular, the gates of transistors 36 are coupled to the gate of reference transistor 38, and a bias current of $I_{max}/2^N$ is coupled to the combination gate and source of transistor 38. In addition, transistor 38 has a channel width-to-length ratio of constant K, and transistors 36 have unique channel width-to-length ratios of approximately $JK/2^N$ with J being an integer in the range of 1 to $2^N$. Thus, the channel width-to-length ratio for transistor 36a is $K/2^N$, the channel width-to-length ratio for transistor 36b is $2K/2^N$, the channel width-to-length ratio for transistor 36c is $(2^N-1)K/2^N$, and the channel width-to-length ratio for transistor 36d is $2^NK/2^N$. These channel width-to-length ratios, which correspond to the relative magnitudes of the reference currents and the bias current, are shown parenthetically next to transistors 36 and transistor 38, respectively.

The current regulators are $2^N$ diodes 40, shown as diodes 40a–40d. Likewise, $2^N$ output nodes 42 are shown as output nodes 42a–42d. Output nodes 42 provide connection points to external circuitry, such as an optional priority encoder which is not shown in FIG. 2. Accordingly, connections 34a–34d serve as summing nodes for transistors 32a–32d, transistors, 36a–36d, diodes 40a–40d, and output nodes 42a–42d, respectively. It is assumed that during normal operation, any external circuitry coupled to output nodes 42 will not substantially affect the operation of circuit 30.

Suppose, for example, that $I_{in}=I_{max}/2$ and N=5. Under these conditions, transistor 32a injects ($I_{max}/2$)($1/2^5$) or $I_{max}/64$ into connection 34a, and the reference current for transistor 36a is ($I_{max}/2^5$)($1/2^5$) or $I_{max}/1024$. Since the current from transistor 32a is larger than the current from transistor 36a, transistor 36a draws $I_{max}/1024$ from connection 34a and, in accordance with Kirchhoff's law, diode 40a draws the difference current of ($I_{max}/64$ minus $I_{max}/1024$) or $15I_{max}/1024$ from connection 34a to ground. The voltage drop across diode 40a raises the voltage at connection 34a to the first voltage indicating a first logic state (such as HIGH) at output node 42a. Diode 40a, in addition to coupling the difference current, clamps the voltage at connection 34a to the first voltage. Continuing with the example, transistor 32d injects ($I_{max}/2$) ($1/2^5$) or $I_{max}/64$ into connection 34d, and the reference current for transistor 36d is ($I_{max}/2^5$)($2^5/2^5$) or $I_{max}/32$. Diode 40d does not couple any appreciable difference current to connection 34d since this would require current through diode 40d in reverse-biased mode. Since transistor 32d couples a substantially constant current, and no other current is coupled to connection 34d, in accordance with Kirchhoff's law, transistor 36d must adjust to couple $I_{max}/64$ to connection 34d. The drain-to-source voltage of transistor 36d does not raise the voltage at connection 34d to the first voltage. Instead, connection 34d assumes the second voltage indicating a second logic state (such as LOW) at output node 42d.

Accordingly, as $I_{in}$ increases from 0 to $I_{max}$, output nodes 42 sequentially change from LOW to HIGH as $I_{in}/2^N$ surpasses the reference currents of transistors 36. For example, at $I_{in}=0$ all output nodes are LOW, at $I_{in}=I_{max}/2$ the first $2^{N-1}$ output nodes are HIGH and the remaining $2^{N-1}$ output nodes are LOW, and at $I_{in}=I_{max}$ all output nodes are HIGH.

If desired, an optional priority encoder may be coupled to output nodes 42 to encode the $2^N$ element "thermometer code" at output nodes 42 into an N-bit binary code. As each output node changes from LOW to HIGH, the value of the N-bit binary code is incremented by one least significant bit (LSB). Furthermore, the priority encoder can amplify the first voltage from the forward-bias voltage at diode 40 to a standard HIGH signal level such as 3 volts or 5 volts. Likewise, the priority encoder can reduce or suppress the second voltage from the drain-to-source voltage at transistor 36 to a standard LOW signal level such as electrical ground.

The logic state associated with connections 34 can be ascertained in other ways as well. For example, rather than measuring the voltage at output nodes 42, the difference current can be measured. For instance, current sensors can be coupled to diodes 40. Or, diodes 40 may be replaced by current-input comparators. With either technique, the difference current may be indicated by a first logic state (such as HIGH), whereas the absence of difference current may be indicated by a second logic state (such as LOW). The logic state can be fed into a latch which is coupled to the priority encoder.

Figure 3A:
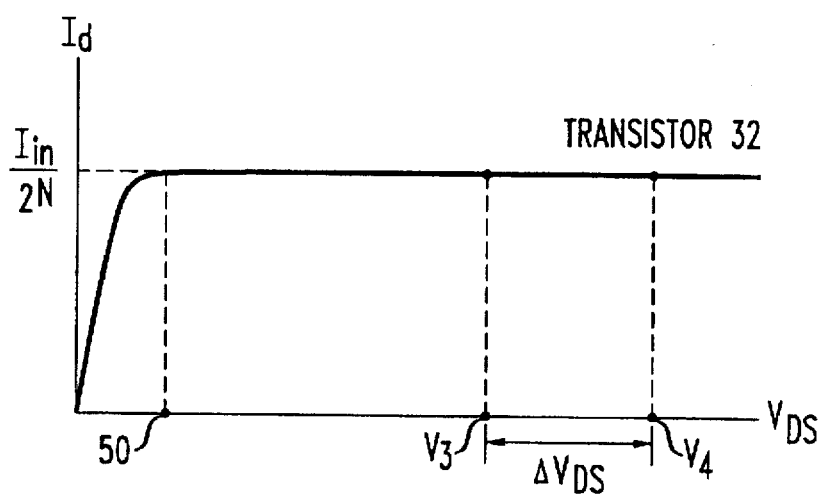
FIG. 3A shows a simplified current/voltage relationship for transistor 32 in the circuit of FIG. 2.
Figure 3B:
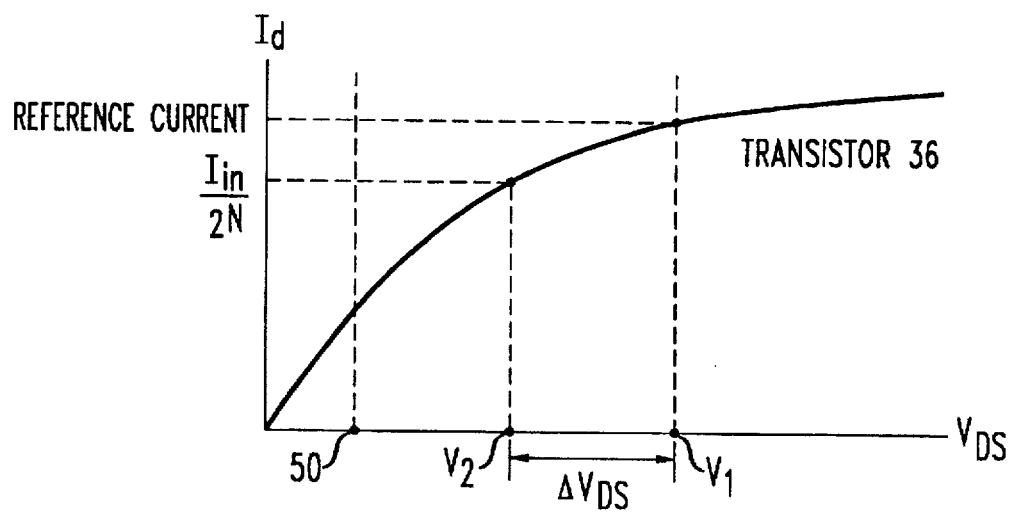
FIG. 3B shows a simplified current/voltage relationship for transistor 36 in the circuit of FIG. 2.
Figure 3C:
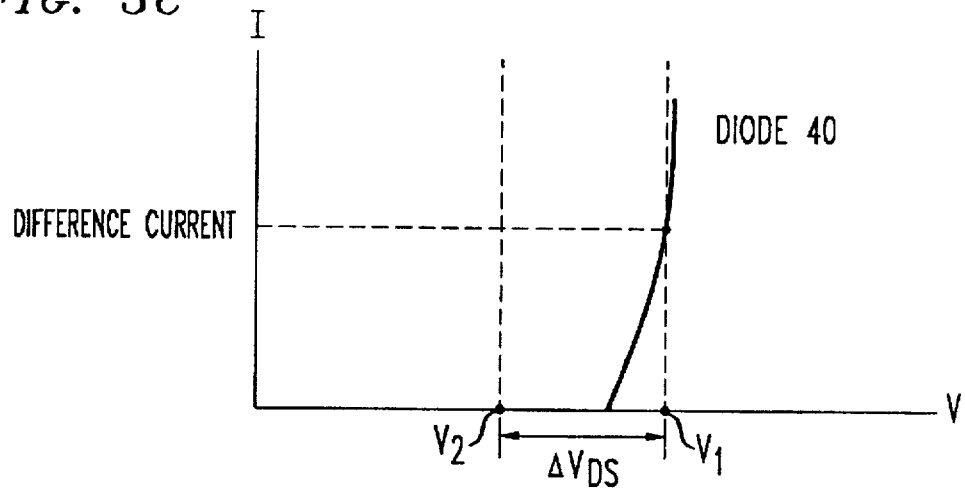
FIG. 3C shows a simplified current/voltage relationship for diode 40 in the circuit of FIG. 2.

Referring to FIGS. 3A–3C, there are shown a simplified current/voltage relationships for certain components of circuit 30. In particular, the current/voltage relationships of a transistor 32, transistor 36 and diode 40 coupled to a respective connection 34 are illustrated. For drain-to-source voltages above break point 50, transistor 32 has a substantially higher output impedance than transistor 36. This is apparent from the slopes of the curves—the drain current of transistor 32 is relatively immune to variations in drain-to-source voltage whereas the drain current of transistor 36 is linearly proportional to variations in drain-to-source voltage. This output impedance mismatch can be provided, for instance, by cascoding transistors 32 (i.e., cascading transistors 32 as common gate amplifiers), or by making the channel lengths of transistors 32 substantially larger than the channel lengths of transistors 36.

If, for instance, $I_{in}/2^N$ is greater than the reference current of the respective transistor 36, then transistor 32 has a drain current of $I_{in}/2^N$ and a drain-to-source voltage $V_3$, transistor 36 has a drain current of the reference current and a drain-to-source voltage $V_1$ (analogous to the first voltage), and diode 40 has a forward biased current, determined by the difference between $I_{in}/2^N$ and the reference current, and a voltage drop $V_1$. It is noted that voltages $V_1$ and $V_3$ are aligned in the drawing for purposes of illustration and need not be equivalent to one another.

Alternatively, if $I_{in}/2^N$ is less than the reference current, then the drain-to-source voltage of transistor 32 increases to $V_3+\Delta V_{DS}$, shown as $V_4$, the drain-to-source voltage of transistor 36 decreases to $V_1-\Delta V_{DS}$, shown as $V_2$ (analogous to the second voltage), and likewise the voltage across diode 40 decreases to $V_1-\Delta V_{DS}$, shown as $V_2$. In effect, $\Delta V_{DS}$ is determined as is necessary to match the currents of transistors 32 and 36. The output impedance of transistor 32 is sufficiently high that, for practical purposes, the drain current of transistor 32 at $V_3+\Delta V_{DS}$ remains approximately $I_{in}/2^N$. The current through diode 40 from ground is essentially zero. As a result, the drain current of transistor 36 at $V_1-\Delta V_{DS}$ is reduced to approximately $I_{in}/2^N$. It is noted that $V_1-\Delta V_{DS}$ is insufficient to turn-on diode 40.

As noted above, the reference currents range from $I_{max}/2^{2N}$ to $I_{max}/2^N$. Therefore, it is preferred that transistors 32 have a relatively high impedance at currents in the range of approximately $I_{max}/2^{2N}$ to $I_{max}/2^N$, and that transistors 36 have relatively low output impedance at currents in the range of approximately $I_{max}/2^{2N}$ to $I_{max}/2^N$.

Circuit 30 consumes a total current of the analog input current combined with the bias current for transistor 38.

Thus, the total current is approximately $I_{in}+I_{max}/2^N$. During typical operation, for large values of N, nearly all the current drawn by circuit 30 is furnished by current source 12. Likewise, nearly all the power for operating circuit 30 is provided by current source 12. This is highly advantageous from a power dissipation standpoint. In addition, the bias current $I_{max}/2^N$ could be scaled to other values as long as the channel width-to length ratios of transistors 36 with respect to transistor 38 are sized accordingly.

It will be appreciated that the values listed above are based on idealized circuit operation during computer simulation, and that therefore relatively minor variations will not substantially affect the operation of circuit 30.

Having described the preferred embodiments of this invention, it will now be apparent to one of ordinary skill in the art that other embodiments incorporating the concept may be used. Therefore, this invention should not be limited to the disclosed embodiment, but rather should be limited only by the spirit and scope of the appended claims.

The invention claimed is:

1. An integrated circuit chip, including an analog-to-digital converter comprising:

a plurality of first current sources, each first current source for coupling to a portion of an analog input current $I_{in}$;

a plurality of second current sources, each second current source associated with a unique reference current;

a plurality of current regulators; and a plurality of conductive channels, each channel coupled to a respective first current source, a respective second current source, and a respective current regulator, wherein for each channel, (a) if the respective first current source couples a larger current to the channel than the reference current associated with the respective second current source, then the respective current regulator couples a difference current to the channel and the respective second current source couples the reference current associated therewith to the channel thereby providing a first logic state associated with the channel, and (b) if the respective first current source couples a smaller current to the channel than the reference current associated with the respective second current source, then the respective current regulator does not couple a difference current to the channel and the respective second current source couples a current to the channel approximately equal to the current coupled to the channel by the respective first current source thereby providing a second logic state associated with the channel, and wherein for each channel the respective first current source has a higher output impedance than the respective second current source.

2. The chip of claim 1 comprising $2^N$ first current sources, N being an integer, wherein for each channel the respective first current source couples a substantially constant current of approximately $I_{in}/2^N$.

3. The chip of claim 2 comprising $2^N$ second current sources wherein for each channel the respective second current source couples a substantially constant current of approximately the reference current associated with the respective second current source in subpart (a) and approximately $I_{in}/2^N$ in subpart (b).

4. The chip of claim 1 wherein for each second current source the associated reference current differs from that of another second current source by a constant quantization level.

5. An integrated circuit chip, including an analog-to-digital converter comprising:

a current splitter for splitting an analog input current $I_{in}$ into a plurality of substantially matched first current sources;

a current generator that provides a plurality of second current sources, each second current source associated with a unique reference current that differs from that of any other second current source;

a plurality of current regulators; and a plurality of conductive channels, each channel providing a summing node coupled to a respective first current source, a respective second current source, and a respective current regulator, wherein for each channel (a) if the respective first current source couples a first current to the channel that is larger than the reference current associated with the respective second current source, then the respective second current source couples the reference current associated therewith to the channel, the respective current regulator couples a difference current to the channel, the difference current representing a difference in current between the first current and the reference current associated with the respective second current source, thereby indicating a first logic state associated with the channel, and (b) if the respective first current source couples a first current to the channel that is smaller than the reference current associated with the respective second current source, then the respective current regulator couples essentially zero current to the channel, thereby forcing the respective second current source to couple approximately the first current to the channel and indicating a second logic state associated with the channel, and wherein the respective first current source has a substantially higher output impedance than the respective second current source.

6. The chip of claim 5 wherein the respective first current source includes a first MOS transistor, the respective second current source includes a second MOS transistor, the first transistor has a smaller drain-to-source voltage in subpart (a) than in subpart (b), and the second transistor has a larger drain-to-source voltage in subpart (a) than in subpart (b).

7. The chip of claim 5 wherein each conductive channel is a separate metallization.

8. The chip of claim 5 wherein the respective current regulator is a diode.

9. The chip of claim 5 wherein the converter is devoid of a resistor ladder network.

10. The chip of claim 5 wherein for each channel the first logic state associated with the channel is indicated by a first voltage at the channel, and the second logic state associated with the channel is indicated by a second voltage at the channel.

11. The chip of claim 5 wherein for each channel the first logic state associated with the channel is indicated by the difference current, and the second logic state associated with the channel is indicated by the essentially zero current.

12. An integrated circuit chip, including an analog-to-digital converter comprising:

a current splitter for splitting an analog input current $I_{in}$ in the range of 0 to $I_{max}$ into a plurality of first current sources, each first current source for generating a substantially constant current of $I_{in}/2^N$ and having a first output impedance when generating $I_{in}/2^N$;

a current generator for providing a plurality of second current sources, each second current source having an output impedance that is low relative to the first output impedance when generating currents in the range of $I_{max}/2^{2N}$ to $I_{max}$, each second current source capable of generating a unique reference current in the range of $I_{max}/2^{2N}$ to $I_{max}$, wherein each reference current differs from a closest reference current by $I_{max}/2^{2N}$;

a plurality of diodes; and a plurality of conductive channels, each channel providing a summing node coupled to a respective first current source, a respective second current source, and a respective diode, wherein one of the respective first and second current sources injects current into the channel, and the other of the respective first and second current sources draws current from the channel, wherein for each channel, (a) if the respective first current source couples a first current to the channel that is larger than the reference current for the respective second current source, then the respective second current source couples the reference current thereof to the channel, and the diode couples a difference current to the channel, the difference current representing a difference in current between the first current and the reference current for the respective second current source, thereby generating a first voltage at the channel representing a first logic level for the channel, and (b) if the respective first current source couples a first current to the channel that is smaller than the reference current for the respective second current source, then the diode couples essentially zero current to the channel, thereby adjusting the respective second current source to couple the first current to the channel and generating a second voltage at the channel representing a second logic level at the channel.

13. An integrated circuit chip, including an analog-to-digital converter comprising:

a current splitter for splitting an analog input current $I_{in}$, in the range of approximately 0 to $I_{max}$, into $2^N$ first current sources, wherein each first current source provides a substantially constant current of approximately $I_{in}/2^N$;

a current generator comprising $2^N$ second current sources, wherein each second current source is capable of providing (i) a substantially constant reference current, different than the reference current of any other second current source by a constant quantization level, and (ii) approximately $I_{in}/2^N$;

$2^N$ current regulators;

$2^N$ output nodes for providing a $2^N$ element digital code associated with $I_{in}$; and $2^N$ conductive channels, each channel coupled between a respective first current source and a respective second current source for unidirectional current flow therebetween, each channel also coupled to a respective current regulator and a respective output node, wherein for each channel, (a) if approximately $I_{in}/2^N$ coupled by the respective first current source to the channel is greater than the reference current for the respective second current source, then the respective second current source couples approximately the reference current thereof to the channel, the respective current regulator couples to the channel a difference current of approximately a difference between $I_{in}/2^N$ and the reference current for the respective second current source, and a first logic state is indicated at the respective output node, and (b) if approximately $I_{in}/2^N$ coupled by the respective first current source to the channel is less than approximately the reference current for the respective second current source then, the respective second current source adjusts to couple approximately $I_{in}/2^N$ to the channel, the respective current regulator couples approximately zero current to the channel, and a second logic state is indicated at the respective output node, and wherein, for each channel, the respective first current source includes a first transistor, the respective second current source includes a second transistor, and the first transistor has a substantially higher output impedance than the second transistor.

14. The chip of claim 13 wherein each reference current is approximately $(J/2^N)(I_{max}/2^N)$, with J being an integer in the range of 1 to $2^N$.

15. The chip of claim 13 wherein each second transistor has a channel width-to-length ratio that differs from that of every other second transistor.

16. The chip of claim 14 wherein each channel width-to-length ratio is approximately $JK/2^N$, with J being an integer in the range of 1 to $2^N$, and K being a constant.

17. The chip of claim 15 wherein each first transistor has a channel width-to-length ratio that is similar to that of every other first transistor.

18. The chip of claim 13 wherein the first transistor has a smaller drain-to-source voltage in subpart (a) than in subpart (b), and the second transistor has a larger drain-to-source voltage in subpart (a) than in subpart (b).

19. The chip of claim 18 wherein the drain-to-source voltage of the first transistor increases in subpart (b) with respect to subpart (a) by a similar amount that the drain-to-source voltage of the second transistor decreases in subpart (b) with respect to subpart (a).

20. The chip of claim 19, wherein, for each channel, the respective first current source comprises the first transistor, the respective second current source comprises the second transistor, and the respective current regulator comprises a diode.

21. The chip of claim 13 wherein a total current coupled to the converter is at most approximately $I_{in}+I_{max}/2^N$.

22. The chip of claim 13, further comprising a priority encoder for converting the $2^N$ element digital code into an N-bit binary digital code.

23. The chip of claim 13 wherein the converter is devoid of a resistor ladder network.

24. A method of performing analog-to-digital conversion, including:

providing a plurality of first current sources each having an impedance;

providing a plurality of second current sources, each second current source having an impedance that is low relative to the impedance of a corresponding one of the first current sources and being associated with a unique reference current that differs from that of any other second current source;

providing a plurality of current regulators;

providing a plurality of conductive channels, each channel coupled to a respective first current source, a respective second current source, and a respective current regulator, such that one of the respective first and second current sources injects current into the channel and the other of the respective first and second current sources draws current from the channel;

coupling an analog input current to the first current sources such that a portion of the analog input current is coupled to and controls each first current source;

generating a first voltage at each channel where the respective first current source couples a larger current to the channel than the reference current associated with the respective second current source, including the respective current regulator coupling a difference current to the channel and the respective second current source coupling the reference current associated therewith to the channel; and generating a second voltage at each channel where the respective first current source couples a smaller current to the channel than the reference current associated with the respective second current source, including the respective current regulator not coupling a difference current to the channel and the respective second current source coupling a current to the channel approximately equal to the current coupled by the respective first current source to the channel.

25. The method of claim 24, including providing the analog input current as $I_{in}$ in the range of 0 to $I_{max}$;

providing $2^N$ first current sources wherein for each channel the respective first current source couples a substantially constant current of approximately $I_{in}/2^N$, and providing $2^N$ second current sources with $2^N$ reference currents in the range of $I_{max}/2^{2N}$ to $I_{max}/2^N$ with each reference current differing from another reference current by $I_{max}/2^{2N}$, wherein for each channel generating the second voltage the respective second current source couples a substantially constant current of approximately $I_{in}/2^N$ to the channel, thereby providing a $2^N$ element digital code associated with $I_{in}$.

26. The method of claim 24 wherein each first current source has a relatively high output impedance for currents in the range of $I_{max}/2^{2N}$ to $I_{max}/2^N$, and each second current source has a relatively low output impedance for currents in the range of $I_{max}/2^{2N}$ to $I_{max}/2^N$.

27. The method of claim 26 wherein each first current source includes a first MOS transistor, each second current source includes a second MOS transistor, and each channel includes a common drain connection between respective first and second transistors.

28. In an integrated circuit chip including a current splitter for splitting an analog input current into a plurality of substantially matched first current sources, a plurality of second current sources with each second current source associated with a unique reference current, a plurality of current regulators, and a plurality of conductive channels with each channel coupled to (1) a respective first current source, (2) a respective second current source with substantially lower output impedance than the respective first current source, and (3) a respective current regulator, a method of performing analog-to-digital conversion comprising the steps of:

applying the analog input current to the current splitter;

providing a first voltage at each channel where current coupled to the channel by the respective first current source is larger than the reference current associated with the respective second current source by operating the respective current regulator to couple a difference current to the channel thereby allowing the respective second current source to couple the reference current associated therewith to the channel; and providing a second voltage at each channel where current coupled to the channel by the respective first current source is equivalent to or smaller than the reference current for the respective second current source by operating the respective current regulator to couple essentially zero current to the channel thereby forcing the respective second current source to couple to the channel essentially the current coupled to the channel by the respective first current source;

thereby providing a digital signal that includes logic states corresponding in one-to-one relationship to the channels wherein each channel at the first voltage indicates a first logic state and each channel at the second voltage indicates a second logic state.

* * * * *